United States Patent
Schack et al.

(10) Patent No.: US 9,510,468 B2
(45) Date of Patent: Nov. 29, 2016

(54) MOBILE TERMINAL COMPRISING LID UNIT WITH KEY DEVICE

(71) Applicant: Huawei Technologies Co., Ltd., Shenzhen, Guangdong (CN)

(72) Inventors: Goran Schack, Shenzhen (CN); Johan Von Konow, Shenzhen (CN)

(73) Assignee: Huawei Technologies Co., Ltd., Shenshen (CN)

( * ) Notice: Subject to any disclaimer, the term of this patent is extended or adjusted under 35 U.S.C. 154(b) by 99 days.

(21) Appl. No.: 13/728,080

(22) Filed: Dec. 27, 2012

(65) Prior Publication Data

US 2013/0114225 A1 May 9, 2013

Related U.S. Application Data

(63) Continuation of application No. PCT/CN2011/081002, filed on Oct. 20, 2011.

(51) Int. Cl.
| | |
|---|---|
| *H04M 1/02* | (2006.01) |
| *H05K 5/00* | (2006.01) |
| *H05K 5/02* | (2006.01) |
| *H01H 9/04* | (2006.01) |
| *H04M 1/23* | (2006.01) |
| *H04M 1/18* | (2006.01) |

(52) U.S. Cl.
CPC .............. *H05K 5/0208* (2013.01); *H01H 9/04* (2013.01); *H04M 1/236* (2013.01); *H01H 2239/006* (2013.01); *H04M 1/0262* (2013.01); *H04M 1/0274* (2013.01); *H04M 1/18* (2013.01); *H04M 2250/22* (2013.01)

(58) Field of Classification Search
CPC ............ H01H 2239/006; H01H 9/04; H04M 1/0262
USPC ........................................................ 361/814
See application file for complete search history.

(56) References Cited

U.S. PATENT DOCUMENTS

| | | | |
|---|---|---|---|
| 2005/0191970 A1 | 9/2005 | Hasegawa | |
| 2006/0044262 A1 | 3/2006 | Ito et al. | |
| 2007/0275772 A1* | 11/2007 | Moon et al. ............... | 455/575.1 |

(Continued)

FOREIGN PATENT DOCUMENTS

| | | | | |
|---|---|---|---|---|
| CA | EP2093979 | * | 8/2009 | ............. H04M 1/02 |
| CN | 1640098 A | | 7/2005 | |

(Continued)

OTHER PUBLICATIONS

International Search Report in corresponding International Patent Application No. PCT/CN2011/081002 (Jul. 26, 2012).

(Continued)

*Primary Examiner* — Jenny L Wagner
*Assistant Examiner* — Michael E Moats, Jr.
(74) *Attorney, Agent, or Firm* — Leydig, Voit & Mayer, Ltd.

(57) ABSTRACT

The invention relates to a mobile terminal comprising a lid unit arranged to substantially block an opening in a mobile terminal housing in an assembled state of the mobile terminal and arranged to allow access through the opening into the interior of the mobile terminal when removed from the opening, wherein the mobile terminal lid unit comprises at least one key device for controlling at least one function on the mobile terminal.

20 Claims, 6 Drawing Sheets

(56) References Cited

U.S. PATENT DOCUMENTS

| | | | |
|---|---|---|---|
| 2008/0122945 A1 | 5/2008 | Ahonen | |
| 2009/0122026 A1 | 5/2009 | Oh | |
| 2009/0137293 A1* | 5/2009 | Yoo | H04N 7/142 455/575.4 |
| 2009/0167545 A1 | 7/2009 | Osaka | |
| 2009/0209306 A1 | 8/2009 | Griffin | |
| 2009/0266697 A1 | 10/2009 | Sugi et al. | |
| 2010/0067204 A1 | 3/2010 | Li et al. | |
| 2010/0110016 A1* | 5/2010 | Ladouceur et al. | 345/173 |
| 2010/0258421 A1 | 10/2010 | Chen et al. | |
| 2011/0191687 A1 | 8/2011 | Takeda et al. | |
| 2011/0278301 A1* | 11/2011 | Sasamori et al. | 220/378 |
| 2012/0115551 A1 | 5/2012 | Cho et al. | |

FOREIGN PATENT DOCUMENTS

| | | |
|---|---|---|
| CN | 101079911 A | 11/2007 |
| CN | 101431563 A | 5/2009 |
| CN | 201238425 Y | 5/2009 |
| CN | 101859659 A | 10/2010 |
| DE | 202007013992 U1 | 3/2008 |
| EP | 0617388 A2 | 9/1994 |
| EP | 1860850 A2 | 11/2007 |
| EP | 1914964 A2 | 4/2008 |
| EP | 2093979 A1 | 8/2009 |
| JP | H03137674 A | 6/1991 |
| JP | H052565 A | 1/1993 |
| JP | H0749981 A | 2/1995 |
| JP | 07115285 A | 5/1995 |
| JP | 2006065695 A | 3/2006 |
| JP | 2006067182 A | 3/2006 |
| JP | 2006108982 A | 4/2006 |
| JP | 2006295699 A | 10/2006 |
| JP | 2008085171 A | 4/2008 |
| JP | 2009159403 A | 7/2009 |
| JP | 2009266751 A | 11/2009 |
| JP | 2010087639 A | 4/2010 |
| JP | 2011166668 A | 8/2011 |
| JP | 2011175611 A | 9/2011 |
| WO | WO 2004004292 A1 | 1/2004 |
| WO | WO 2007148163 A1 | 12/2007 |
| WO | WO 2011/008024 A2 | 1/2011 |

OTHER PUBLICATIONS

Written Opinion of the International Searching Authority in corresponding International Patent Application No. PCT/CN2011/081002 (Jul. 26, 2012).

Extended European Search Report in corresponding European Patent Application No. 11864862.5 (Jun. 3, 2013).

"HTC Desire HD (G10) Official Website Perfect Instructions," HTC Corporation, New Taipei City, Taiwan (Dec. 31, 2010).

* cited by examiner

MOBILE TERMINAL COMPRISING LID UNIT WITH KEY DEVICE

CROSS-REFERENCE TO RELATED APPLICATIONS

This application is a continuation of International Patent Application No. PCT/CN2011/081002, filed on Oct. 20, 2011, which is hereby incorporated by reference in their entirety.

TECHNICAL FIELD

The present invention relates to a mobile terminal comprising a lid unit arranged to substantially block an opening in a mobile terminal housing in an assembled state of the mobile terminal and arranged to allow access through the opening into the interior of the mobile terminal when removed from the opening.

BACKGROUND OF THE INVENTION

Mobile terminals, e.g. mobile telephones, mobile user equipment, personal digital assistants, mobile computers, tablet computers, notebook computers, laptop computers, etc., usually comprise at least one component part such as a battery, a SIM-card, a memory card, etc. which needs to be protected from the environment outside the mobile terminal during use as the environment may contain e.g. particles or moisture and which component part at the same time needs to be easily accessible from the outside of the mobile terminal for e.g. replacement purposes.

In order to at the same time both protect and grant easy access to a component part such as a memory card inside a mobile terminal, a removable lid covering the access opening in a mobile terminal housing for the component part to be both protected and accessed may be arranged on the mobile terminal. If the mobile terminal is to be used in a very dusty and/or very moist environment, a dust proof and/or moisture proof seal may be arranged between the mobile terminal housing and the lid in order to further protect the interior of the mobile terminal housing during use by preventing dust and/or moisture from entering the interior of the mobile terminal housing through the access opening. Such a seal may be arranged by arranging a lid of rubber material which lid is arranged in the assembled state of the mobile terminal to both cover the access opening and in a sealing manner abut against the exterior mobile terminal housing surface along the edge of the access opening.

SUMMARY OF THE INVENTION

The object of the present invention is to provide a mobile terminal with improved water protection of the mobile terminal housing, i.e. protection against moisture entering the interior of the mobile terminal from the outside of the mobile terminal housing.

The object is achieved by arranging a mobile terminal comprising a lid unit arranged to substantially block an opening in a mobile terminal housing in an assembled state of the mobile terminal and arranged to allow access through the opening into the interior of the mobile terminal when removed from the opening, which mobile terminal lid unit further comprises at least one key device for controlling at least one function on the mobile terminal.

By arranging at least one key device in a mobile terminal lid unit, where the key device is arranged to control at least one function on the mobile terminal, it is possible to decrease the number of openings in the mobile terminal housing for key devices arranged to control at least one function on the mobile terminal, this as the functionality of a latter type of key device arranged in an own from a lid opening separate opening may be replaced by the functionality of a former type of key device arranged in the same opening as said lid unit. By decreasing the number of openings in the mobile terminal housing, fewer openings in the mobile terminal housing have to be sealed in order to prevent moisture from entering the interior of the mobile terminal, whereby the water protection of the mobile terminal housing is improved.

Another advantage of improving the water protection of the mobile terminal housing according to the present invention is that by decreasing the number of openings required in the mobile terminal housing, the freedom of designing the mobile terminal housing increases as fewer parts of the mobile terminal have influence on the outlines of external surface of the mobile terminal, thus decreasing the design restrictions that the openings in the mobile terminal housing have on the freedom to design the mobile terminal housing.

A further advantage of improving the water protection of the mobile terminal housing according to the present invention is that by decreasing the number of openings required in the mobile terminal housing, the cost for sealing off the interior of the mobile terminal from the outside environment may be decreased.

Yet another advantage of improving the water protection of the mobile terminal housing according to the present invention is that by decreasing the number of openings required in the mobile terminal housing, the impact of the openings on the strength of the mobile terminal housing may be decreased.

This present invention also achieves the possibility to decrease the cost of sealing the opening or openings in a mobile terminal housing.

It is according to the present invention possible to altogether eliminate all key devices arranged in own from a lid opening separate openings, whereby it is possible to achieve improved water protection of the mobile terminal housing and at the same time to achieve a very minimalistic design of the outlines of the external surface of the mobile terminal as the mobile terminal housing in this case comprises one opening only to be sealed in order to prevent moisture from entering the interior of the mobile terminal, which opening may be arranged at a preferred location on the mobile terminal housing. It would e.g. be possible to arrange said opening with such dimensions that all parts of the mobile terminal that need to be accessible from the outside such as e.g. a replaceable battery and/or a replaceable SIM-card and/or a replaceable memory card etc. could be accessible through one and the same opening in a mobile terminal housing. A one and the same lid unit could be arranged to allow access through the opening into the interior of the mobile terminal when removed from the opening, which opening could be substantially blocked by said lid unit in the assembled state of the mobile terminal. Said mobile terminal lid unit could comprise only one single key device for controlling at least one function on the mobile terminal, e.g. to control the function of powering up the mobile terminal, where the powering down could be controlled e.g. by using a virtual key on at least a part of a capacitive touch panel used as an image output device on the mobile terminal. If the said single key device is of a type that does not need to extend all the way through the lid unit and thus may be arranged in a watertight manner on the said single lid unit, and if possible other devices such as e.g. microphones and/or speakers etc. also are arranged in a watertight manner on the mobile terminal, e.g. on the housing and/or the lid unit, only one opening on the whole mobile terminal housing in which a part of the mobile terminal is movably arranged needs to be sealed, thus significantly improving the water protection of the mobile terminal housing.

The sealing between the mobile terminal housing and the lid unit which is arranged to substantially block an opening in a mobile terminal housing in an assembled state of the mobile terminal may be implemented by sealing means integrated in the mobile terminal housing and/or sealing means integrated in the lid unit and/or separate sealing means.

The mobile terminal lid unit is thus arranged to enable access to at least one component part arranged inside the mobile terminal housing together with protecting the component part or parts from the environment outside the mobile terminal housing and controlling at least one function of the mobile terminal.

Functions controlled by keys on mobile terminals may e.g. be speaker volume and/or microphone volume and/or power on and/or power off for the mobile terminal, camera functions, etc.

In addition to preventing moisture such as water and/or other fluids from entering the interior of the mobile terminal in assembled state of the mobile terminal, the lid unit may also prevent dust particles and/or other solids and/or gases from entering the interior of the mobile terminal.

According to one embodiment of the invention, the key device is a physical key.

According to another embodiment of the invention, the key device is a virtual key.

Further advantages of the invention will be apparent from the following detailed description.

BRIEF DESCRIPTION OF THE DRAWINGS

The appended drawings are intended to clarify and explain different embodiments of the present invention in which.

DETAILED DESCRIPTION OF THE INVENTION

Figure 1:
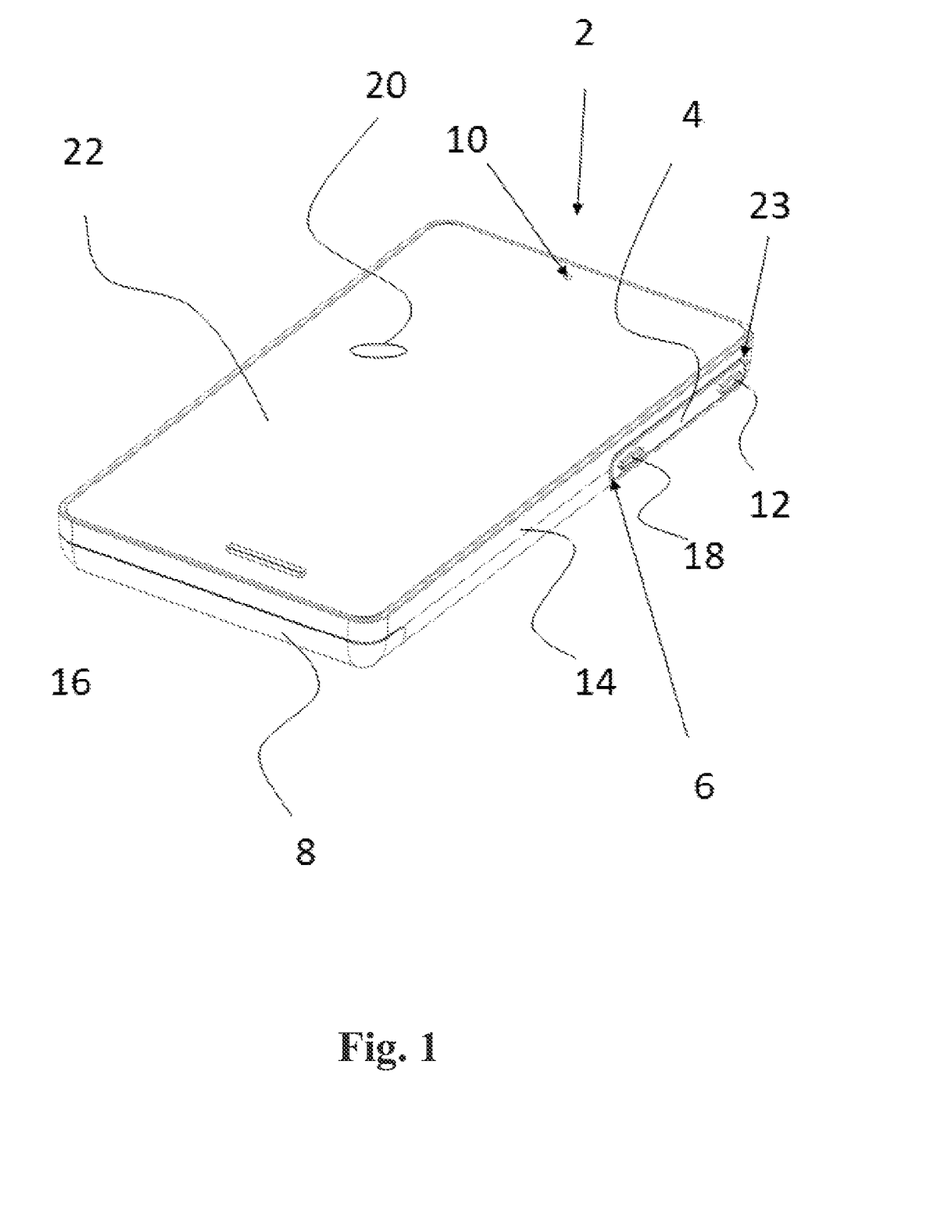
FIG. 1 shows a mobile terminal in assembled state.

FIG. 1 shows a mobile terminal 2 in assembled state, where the mobile terminal 2 comprises a lid unit 4 arranged to substantially block an opening 6 in a mobile terminal housing 8 in an assembled state of the mobile terminal 2 and arranged to allow access through the opening 6 into the interior 10 of the mobile terminal 2 when removed from the opening 6, wherein the mobile terminal lid unit 4 comprises at least one key device 12 for controlling at least one function on the mobile terminal 2.

As can be seen in the figure, the lid unit 4 may be inserted at least in part into the opening 6 in the assembled state of the mobile terminal 2.

The lid unit 4 may e.g. be detachably arranged on the mobile terminal 2, or be pivotally attached to the mobile terminal 2 e.g. using a hinge, or be slidably attached to the mobile terminal 2 e.g. in a sliding tray fashion.

By arranging a mobile terminal 2 comprising a lid unit 4 as mentioned above, the object of providing a mobile terminal 2 with improved water protection of the mobile terminal housing 8, i.e. protection against moisture entering the interior of the mobile terminal 2 from the outside of the mobile terminal housing 8, is achieved.

By arranging at least one key device 12 in a mobile terminal lid unit 4, where the key device 12 is arranged to control at least one function on the mobile terminal 2, it is possible to decrease the number of openings in the mobile terminal housing 8 for key devices arranged to control at least one function on the mobile terminal, this as the functionality of a latter type of key device arranged in an own from a lid opening separate opening may be replaced by the functionality of a former type of key device arranged in the same opening 6 as said lid unit 4.

By decreasing the number of openings in the mobile terminal housing 8, fewer openings in the mobile terminal housing 8 have to be sealed in order to prevent moisture from entering the interior 10 of the mobile terminal 2, whereby the water protection of the mobile terminal housing 8 is improved.

Another advantage of improving the water protection of the mobile terminal housing 8 according to the present invention is that by decreasing the number of openings required in the mobile terminal housing 8, the freedom of designing the mobile terminal housing 8 increases as fewer parts 4 of the mobile terminal 2 have influence on the outlines of external surface 14 of the mobile terminal 2, thus decreasing the design restrictions that the openings in the mobile terminal housing 8 have on the freedom to design the mobile terminal housing 8.

A further advantage of improving the water protection of the mobile terminal housing 8 according to the present invention is that by decreasing the number of openings required in the mobile terminal housing 8, the cost for sealing off the interior 10 of the mobile terminal 2 from the outside environment 16 may be decreased.

Yet another advantage of improving the water protection of the mobile terminal housing 8 according to the present invention is that by decreasing the number of openings required in the mobile terminal housing 8, the impact of the openings on the strength of the mobile terminal housing 8 may be decreased.

This present invention also achieves the possibility to decrease the cost of sealing the opening 6 or openings in a mobile terminal housing 8.

In the embodiment shown in FIG. 1, two key devices 12, 18 are shown on the lid unit 4.

It is according to the present invention possible to altogether eliminate all key devices arranged in own from a lid opening 6 separate openings, whereby it is possible to achieve improved water protection of the mobile terminal housing 8 and at the same time to achieve a very minimalistic design of the outlines of the external surface 14 of the mobile terminal 2 as the mobile terminal housing 8 in this case comprises one opening 6 only to be sealed in order to prevent moisture from entering the interior 10 of the mobile terminal 2, which opening 6 may be arranged at a preferred location on the mobile terminal housing 8. It would e.g. be possible to arrange said opening 6 with such dimensions that all parts of the mobile terminal 2 that need to be accessible from the outside 16 such as e.g. a replaceable battery and/or a replaceable SIM-card and/or a replaceable memory card etc. could be accessible through one and the same opening 6 in a mobile terminal housing 8. A one and the same lid unit 4 could be arranged to allow access through the opening 6 into the interior 10 of the mobile terminal 2 when removed from the opening 6, which opening 6 could be substantially blocked by said lid unit 4 in the assembled state of the mobile terminal 2. Said mobile terminal lid unit 4 could comprise only one single key device 12 for controlling at least one function on the mobile terminal 2, e.g. to control the function of powering up the mobile terminal, where the powering down could be controlled e.g. by using a virtual key 20 on at least a part of a capacitive touch panel 22 used as an image output device on the mobile terminal 2. If the said single key device 12 is of a type that does not need to extend all the way through the lid unit 4 and thus may be arranged in a watertight manner on the said single lid unit 4, and if possible other devices such as e.g. microphones and/or speakers etc. also are arranged in a watertight manner on the mobile terminal 2, e.g. on the housing and/or the lid unit, only one opening 6 on the whole mobile terminal housing 8 in which a part 4 of the mobile terminal 2 is movably arranged needs to be sealed, thus significantly improving the water protection of the mobile terminal housing 8.

The sealing between the mobile terminal housing 8 and the lid unit 4 which is arranged to substantially block an opening 6 in a mobile terminal housing 8 in an assembled state of the mobile terminal 2 may be implemented by sealing means 23, which sealing means may be integrated in the mobile terminal housing and/or in the lid unit and/or be separate sealing means.

The mobile terminal lid unit 4 is thus arranged to enable access to at least one component part arranged inside the mobile terminal housing 8 together with protecting the component part or parts from the environment 16 outside the mobile terminal housing 8 and controlling at least one function of the mobile terminal 2.

Functions controlled by keys on mobile terminals may e.g. be speaker volume and/or microphone volume and/or power on and/or power off for the mobile terminal, camera functions, etc.

In addition to preventing moisture such as water and/or other fluids from entering the interior 10 of the mobile terminal 2 in assembled state of the mobile terminal 2, the lid unit 4 may also prevent dust particles and/or other solids and/or gases from entering the interior 10 of the mobile terminal 2.

Figure 2:
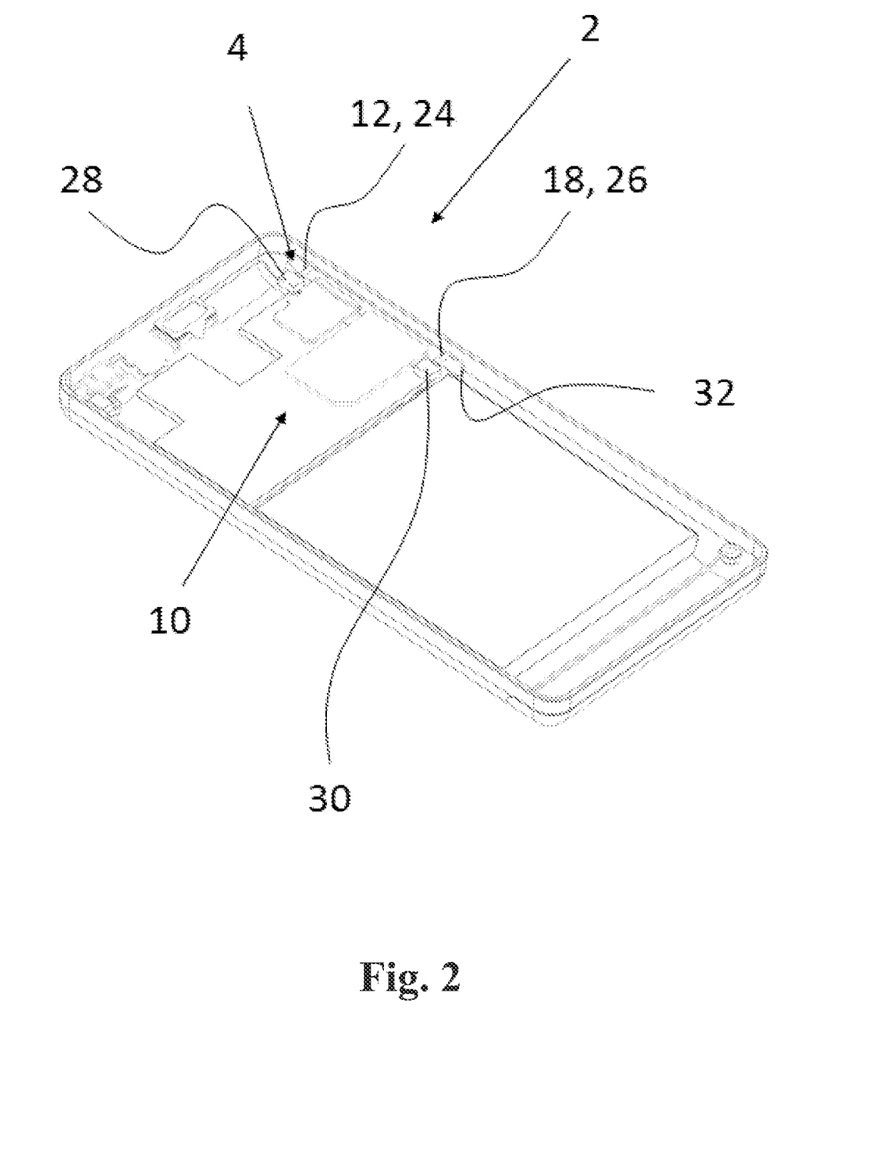
FIG. 2 shows a mechanical solution according an embodiment of the invention.

FIG. 2 shows a mechanical solution according to an embodiment of the invention, where the interior 10 of the mobile terminal 2 is exposed, according to which embodiment the key device 12, 18 comprises a physical key 24, 26. According to this embodiment, a detection switch 28, 30 is arranged to detect the movement of a key 24, 26. According to this embodiment, the lid unit 4 comprises a lid 32 where further at least a part of said physical key 24, 26 is movably arranged in relation to the lid 32.

Figure 3:
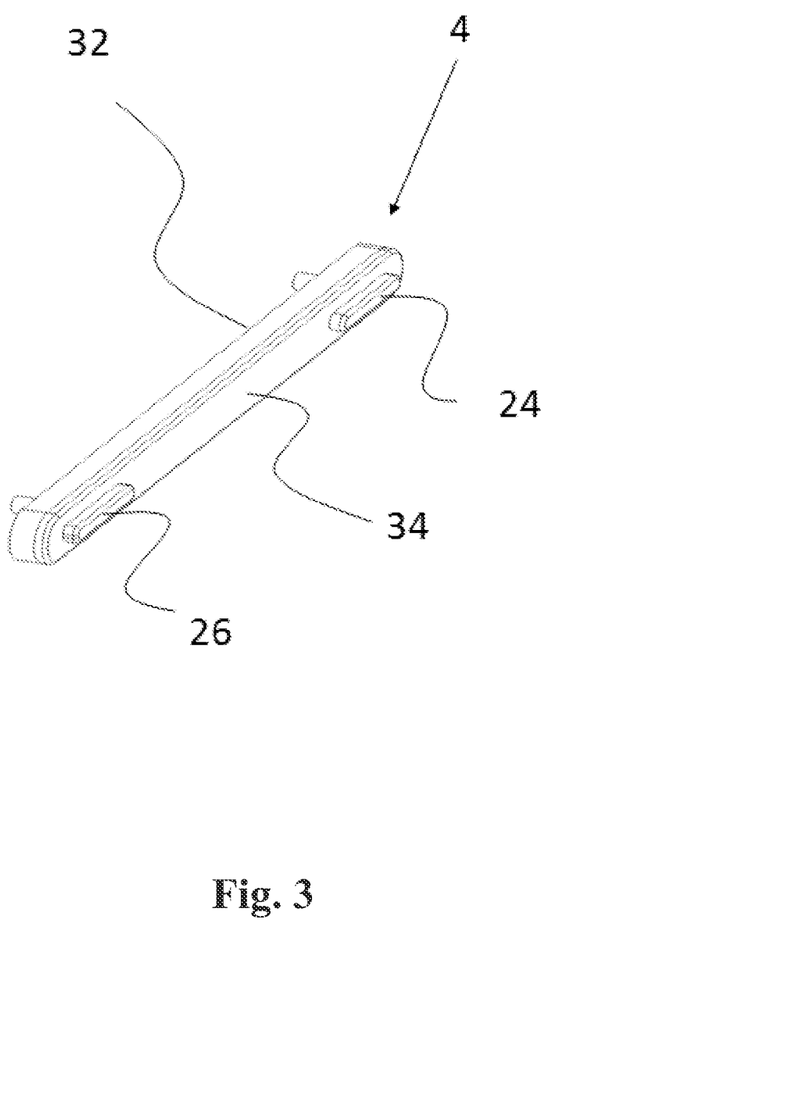
FIG. 3 shows the embodiment of the lid unit shown in FIG. 2.

FIG. 3 shows the embodiment of the lid unit 4 shown in FIG. 2 from another angle. As can be seen in the figure, the lid unit 4 comprises a lid 32 and at least one physical key 24, 26 movably arranged in relation to the lid 32. A stop member 34 may be arranged to prevent the keys 24, 26 from separating from the lid 32.

The lid 32 and the at least one key 24, 26 is assembled together into one part where the at least one key is able to move in relation to the lid 32. A Printed Circuit Board (PCB) or a Flexible Printed Circuit (FPC) may be added to this unit with solder switches that may be connected to corresponding part in the mobile terminal interior in the assembled state of the mobile terminal. Optionally, the Printed Circuit Board (PCB) or a Flexible Printed Circuit (FPC) may be arranged in the interior of the mobile terminal. It is possible to use different types of detection switches. The keys 24, 26 may be of different types, e.g. a hardtop with a keytop part in silicon rubber or other soft material glued together, or hardtop with backside and single keys mounted between, or unit glued or ultrasound welded together into one unit.

As mentioned above, the movement of said at least one physical key 24, 26 is arranged to influence a detection switch, where the detection switch may be arranged in the lid unit 4 and may be arranged on a PCB or a FPC arranged in the lid unit 4. Optionally, the detection switch may be arranged in the interior of the mobile terminal and may be arranged on a PCB or a FPC arranged in the interior of the mobile terminal.

Figure 4:
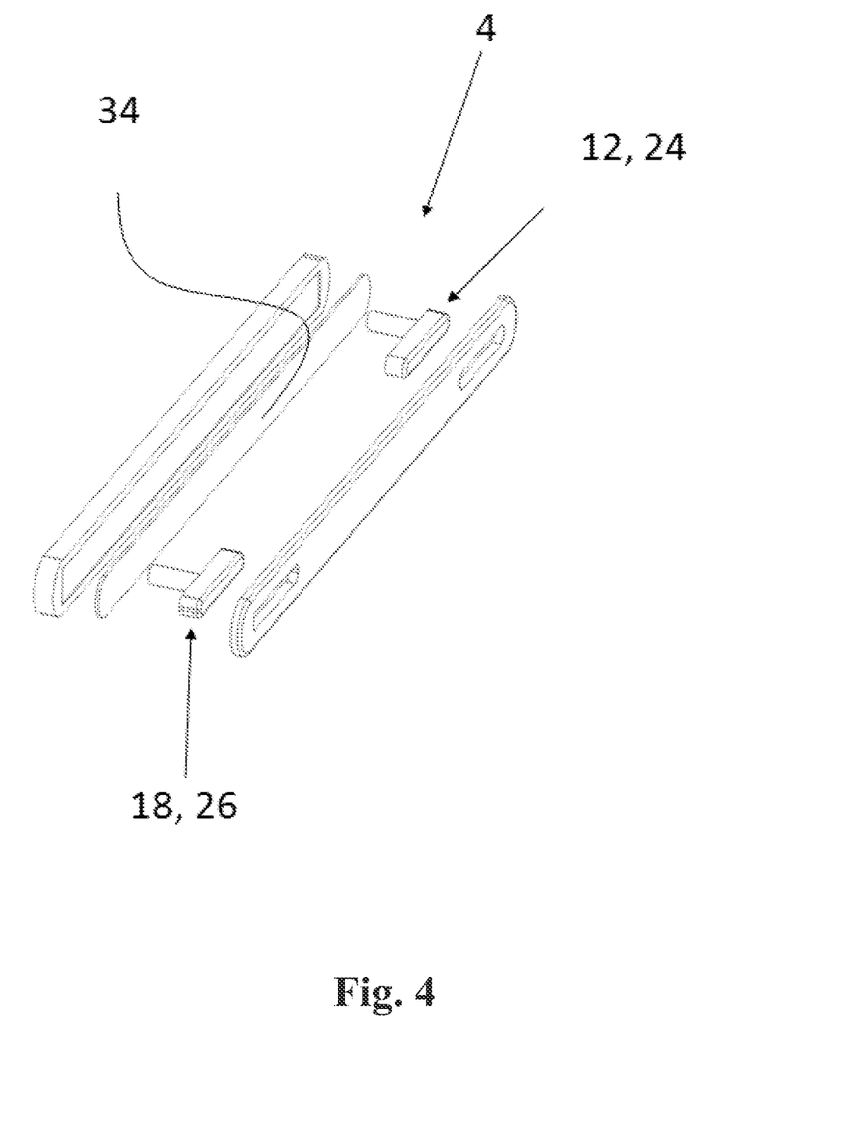
FIG. 4 shows another embodiment of the lid unit in exploded view.

FIG. 4 shows another embodiment of the lid unit 4 in exploded view according to which embodiment the key device 12, 18 comprises a physical key 24, 26 wherein the movement of at least one physical key 24, 26 is arranged to influence a resistive touch sensor 34.

The resistive touch sensor 34 has two layers that are not in contact with each other in rest position, where the outer layer is a flexible layer coated on the inside with a conductor, e.g. Indium Tin Oxide (ITO) and the inner layer is a supporting layer of e.g. glass coated on its outside face with a conductor, e.g. ITO. Non conductive separator "dots" of e.g. mica or silica are arranged between the outer and the inner layer. When the outer flexible layer is pressed against the inner layer, the resulting voltages can be measured in more than one direction, and by comparing these voltages to the starting voltage, the point where the outer layer was pressed can be calculated.

The resistive touch sensor 34 may be a resistive touch panel, and may further be arranged in the lid unit 4. The resistive touch sensor 34 may be connected to a PCB or a FPC arranged in the interior of the mobile terminal.

Comparing to the embodiment shown in FIG. 3, the detection switches shown in FIG. 3 are replaced by the resistive touch sensor 34. The feeling of a keystroke may be integrated into this embodiment by adding a dome to the resistive touch sensor.

Figure 5:
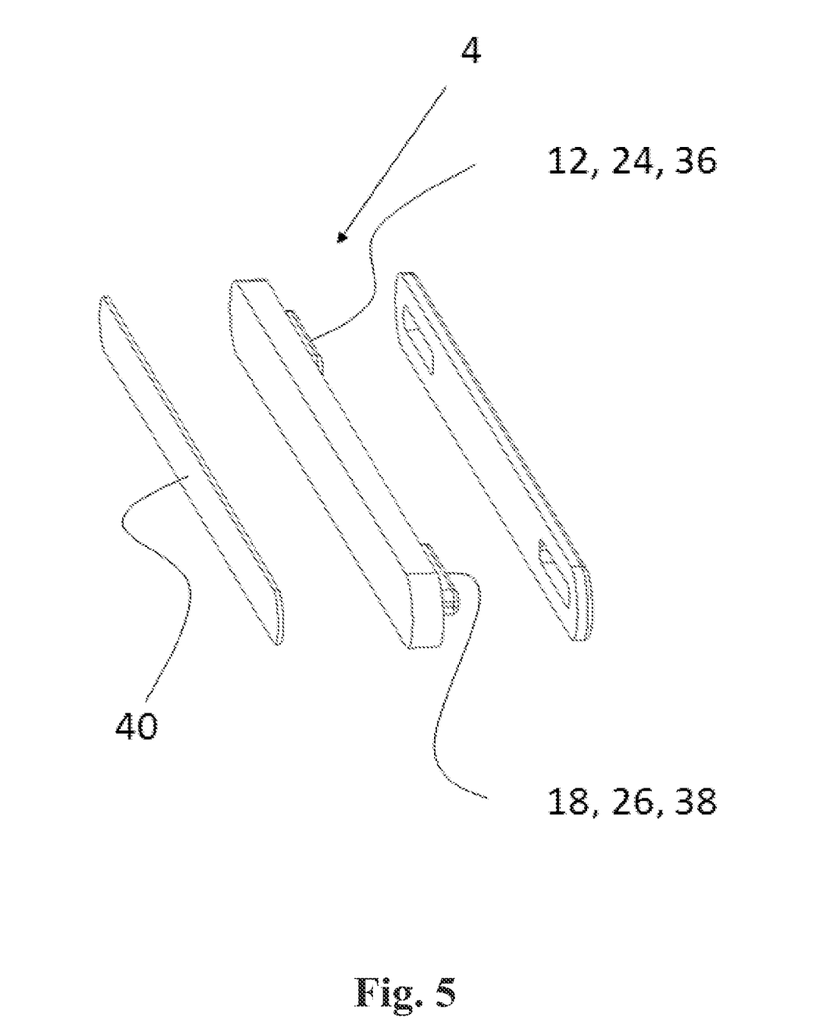
FIG. 5 shows another embodiment of the lid unit in exploded view.

FIG. 5 shows another embodiment of the lid unit 4 in exploded view according to which embodiment the key device 12, 18 comprises a physical key 24, 26 wherein the at least one physical key 24, 26 is arranged with a capacitance 36, 38 and where the movement of said physical key 24, 26 is arranged to influence a capacitive touch sensor 40.

A capacitive touch sensor 40 comprises a support part of e.g. a glass sheet with a conductive coating on one side. A circuit pattern around the support part sets a charge across the support part surface which charge is disturbed by e.g. a finger or another means creating an electrical disturbance of the charge when touching or nearly touching the screen.

The capacitive touch sensor 40 may be a capacitive touch panel, and may further be arranged in the lid unit 4.

The capacitive touch sensor 40 may be arranged at the side of the lid unit 4 facing towards the interior of the mobile terminal, or at the side of the lid unit 4 facing towards the exterior of the mobile terminal or be arranged there between. The capacitive touch sensor 40 may be connected to a PCB or a FPC arranged in the interior of the mobile terminal, and may further be connected to the main electrical board of the mobile terminal.

Comparing to the embodiment shown in FIG. 3, the detection switches shown in FIG. 3 are replaced by the capacitive touch sensor 40. The feeling of a keystroke may be integrated into this embodiment by adding a dome to the capacitive touch sensor.

Figure 6:
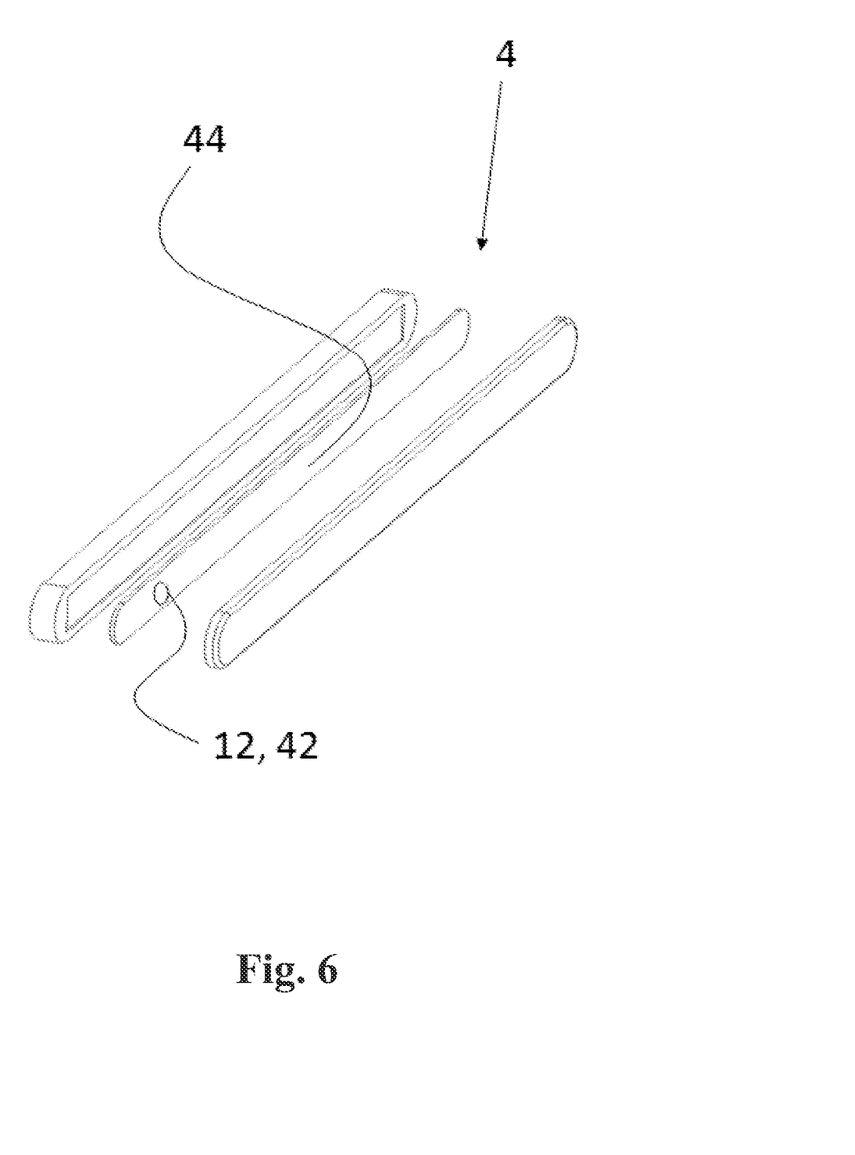
FIG. 6 shows another embodiment of the lid unit in exploded view.

FIG. 6 shows another embodiment of the lid unit 4 in exploded view wherein said key device 12 comprises a virtual key 42. The virtual key 42 may be arranged on at least a part of a capacitive touch sensor 44, wherein further the capacitive touch sensor 44 may be a capacitive touch panel.

The capacitive touch sensor 44 may be arranged in the lid unit 4, and may further be arranged at the side of the lid unit 4 facing towards the interior of the mobile terminal or at the side of the lid unit 4 facing towards the exterior of the mobile terminal.

The capacitive touch sensor 44 may be connected to a PCB or a FPC arranged in the interior of the mobile terminal, and may further be connected to the main electrical board of the mobile terminal.

As no mechanical movement in the lid unit 4 is needed to active the capacitive touch sensor when using e.g. a finger to activate the capacitive touch sensor 44, this solution does not need any moving parts in the lid unit 4. The capacitive touch sensor 44 may be mounted on any side of the lid and also molded into the lid unit 4, i.e. overmolded by plastic material.

Also other types of mechanical and/or virtual keys are possible. The virtual key may e.g. also comprise an infrared sensor, wherein the infrared sensor may be an infrared touch sensor.

The present invention is not limited to the embodiments described above, but also relates to and incorporates all embodiments within the scope of the appended independent claim.

What is claimed is:

1. Mobile terminal comprising a lid unit arranged to substantially block an opening in a mobile terminal housing in an assembled state of the mobile terminal and arranged to allow access through the opening into the interior of the mobile terminal when removed from the opening, the lid unit is inserted at least in part into the opening in the assembled state of the mobile terminal; wherein the mobile terminal lid unit comprises two key devices for controlling at least one function on the mobile terminal; wherein the two key devices on the mobile terminal control at least one of the following functions for the mobile terminal: speaker volume, microphone volume, and camera; and the opening is configured to accommodate a replaceable SIM-card and/or a replaceable memory card of the mobile terminal that need to be accessible from the outside, wherein the at least one of the replaceable SIM-card and the replaceable memory is accessible through the opening in the mobile terminal housing.

2. Mobile terminal according to claim 1, wherein said key device comprises a physical key.

3. Mobile terminal according to claim 2, wherein said lid unit comprises a lid and where at least a part of said physical key is movably arranged in relation to the lid.

4. Mobile terminal according to claim 3, wherein the movement of said physical key is arranged to influence a detection switch.

5. Mobile terminal according to claim 4, wherein the detection switch is arranged in the lid unit.

6. Mobile terminal according to claim 4, wherein the detection switch is arranged in the interior of the mobile terminal.

7. Mobile terminal according to claim 3, wherein the movement of said physical key is arranged to influence a resistive touch sensor.

8. Mobile terminal according to claim 7, wherein the resistive touch sensor is arranged in the lid unit.

9. Mobile terminal according to claim 3, wherein the physical key is arranged with a capacitance and where the movement of said physical key is arranged to influence a capacitive touch sensor.

10. Mobile terminal according to claim 9, wherein the capacitive touch sensor is arranged in the lid unit.

11. Mobile terminal according to claim 9, wherein the capacitive touch sensor is arranged at the side of the lid unit facing towards the interior of the mobile terminal.

12. Mobile terminal according to claim 9, wherein the capacitive touch sensor is arranged at the side of the lid unit facing towards the exterior of the mobile terminal.

13. Mobile terminal according to claim 1, wherein said key device comprises a virtual key.

14. Mobile terminal according to claim 13, wherein the virtual key is arranged on at least a part of a capacitive touch sensor.

15. Mobile terminal according to claim 14, wherein the capacitive touch sensor is arranged at the side of the lid unit facing towards the interior of the mobile terminal.

16. Mobile terminal according to claim 14, wherein the capacitive touch sensor is arranged at the side of the lid unit facing towards an exterior of the mobile terminal.

17. Mobile terminal according to claim 13, wherein the virtual key comprises an infrared sensor.

18. Mobile terminal according to claim 17, wherein the infrared sensor is an infrared touch sensor.

19. Mobile terminal according to claim 1, wherein the lid unit is detachably arranged on the mobile terminal.

20. Mobile terminal according to claim 1, wherein the lid unit is pivotally or slidably attached to the mobile terminal.

* * * * *